(12) United States Patent
Ronte et al.

(10) Patent No.: US 8,355,467 B2
(45) Date of Patent: Jan. 15, 2013

(54) AMPLITUDE PROBABILITY DISTRIBUTION MEASUREMENT APPARATUS

(75) Inventors: Sunao Ronte, Atsugi (JP); Satoru Arakawa, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 422 days.

(21) Appl. No.: 12/730,825

(22) Filed: Mar. 24, 2010

(65) Prior Publication Data

US 2010/0246653 A1    Sep. 30, 2010

(30) Foreign Application Priority Data

Mar. 31, 2009    (JP) .................................. 2009-087584

(51) Int. Cl.
*H04L 27/00*    (2006.01)

(52) U.S. Cl. ........................................ 375/316; 375/224

(58) Field of Classification Search .................. 375/224, 375/319, 316; 324/76.21, 76.28, 76.23, 76.27; 708/204

See application file for complete search history.

(56) References Cited

U.S. PATENT DOCUMENTS

| | | | | |
|---|---|---|---|---|
| 4,279,019 | A * | 7/1981 | Heyser ........................... | 702/140 |
| 6,112,067 | A * | 8/2000 | Seike et al. ................. | 455/226.4 |
| 2006/0206550 | A1* | 9/2006 | Uchino ........................... | 708/204 |
| 2010/0075704 | A1* | 3/2010 | McHenry et al. .............. | 455/509 |

FOREIGN PATENT DOCUMENTS

| | | |
|---|---|---|
| JP | 2008-039762 | 2/2008 |
| JP | 2008-275401 | 11/2008 |

OTHER PUBLICATIONS

Sakurai et al., "Trends in and Future Prospects for Terrestrial Digital Broadcasting"; Toshiba Review, vol. 58, No. 12, 2003; p. 2-6 along with an English Translation.

"Orthogonal Frequency Division Multiplex (OFDM)"; Toshiba Review, vol. 58, No. 12, 2003; p. 2-6.

* cited by examiner

*Primary Examiner* — Shuwang Liu
*Assistant Examiner* — Helene Tayong
(74) *Attorney, Agent, or Firm* — Greer, Burns & Crain, Ltd.

(57) ABSTRACT

There is disclosed a general-purpose APD measurement apparatus capable of changing a measurement condition, such as the number of channels or a resolution bandwidth (RBW) in compliance with a standard for the subject of measurement, measuring various subjects of measurement, and correcting measurement equipment, thereby enabling a higher accuracy of measurement. The resolution bandwidth (RBW) or the number of channels when measurement is performed can be flexibly changed by controlling the cycle of a clock signal whose data are sampled by A/D conversion means 110, frequency selection means 130, and an APD unit 300. The frequency selection means 130 includes FFT type processing means 131 and filter bank type processing means 132 arranged in parallel. The output of FFT type processing means 131 is corrected based on the output of the filter bank type processing means 132 with a high accuracy of measurement. Accordingly, a higher accuracy of measurement is made possible.

3 Claims, 13 Drawing Sheets

AMPLITUDE PROBABILITY DISTRIBUTION MEASUREMENT APPARATUS

CROSS-REFERENCE TO RELATED APPLICATION

This application claims priority to and the benefit of Japanese Patent Application No. 2009-87584 filed on Mar. 31, 2009, the disclosure of which is incorporated herein by reference in its entirety.

BACKGROUND

1. Field of the Invention

The present invention relates to an Amplitude Probability Distribution (hereinafter referred to as an 'APD' and also simply referred to as an 'hour rate') measurement apparatus for measuring a probability that the size of a frequency component will exceed a predetermined threshold value by analyzing the frequency components of a signal.

2. Discussion of Related Art

An APD measurement technique has conventionally existed. The amplitude of a signal is closely related with the frequency band including the signal. Here, the signal is referred to as an input signal. It is assumed that the frequency component includes frequency band components. There has been known a Fast Fourier Transform (hereinafter referred to as 'FFT') type APD measurement apparatus disclosed in Japanese Unexamined Patent Application Publication No. 2008-039762 (hereinafter referred to as 'Patent Document 1') and a filter bank type APD measurement apparatus disclosed in Japanese Unexamined Patent Application Publication No. 2008-275401 (hereinafter referred to as 'Patent Document 2'). The FFT type APD measurement apparatus is configured to separate an input signal into frequency band components using FFT and extract specific frequency band components from the input signal. The filter bank type APD measurement apparatus includes filters arranged in parallel and configured to extract specific frequency band components from an input signal, and it separates an input signal into frequency band components and extracts specific frequency band components from the input signal.

Meanwhile, with the recent appearance of the Orthogonal Frequency Division Multiplex (OFDM) scheme, the use efficiency of the frequency is increased and multi-channel is in progress. TOSHIBA REVIEW VOL. 58 No. 12 2003, p 2~6 discloses a description relating to the OFDM scheme (i.e., the standards and the transmission methods for terrestrial digital broadcasting). In the OFDM scheme, digital modulation is performed on transmission data with the transmission data divided into several thousands of low-speed data in a predetermined band. For example, in terrestrial digital broadcasting, a predetermined band is about 5.6 MHz. Thus, digital modulation is performed on transmission data with the transmission data divided into a total of 5,600 carriers, each having about 1 kHz.

As described above, even in the case of, for example, the standard for terrestrial digital broadcasting, in APD measurement in the OFDM scheme, the frequency of a signal must be analyzed using the channel interval of each signal component having about 1 kHz, and the APD of each frequency band component must be measured for several thousands of channel units. Furthermore, the APD measurement apparatus disclosed in Patent Document 2 has been known to perform measurements for a plurality of channels at the same time.

SUMMARY OF THE INVENTION

Although, for example, terrestrial digital broadcasting for the OFDM scheme has been described above, the OFDM scheme is not used for only terrestrial digital broadcasting, but being widely used for various standards, such as portable phones and wireless LAN. If the standard for the subject of measurement is different, measurement conditions, such as a channel interval or the number of channels, are changed. Accordingly, it is necessary to flexibly change measurement conditions, such as the number of channels, a resolution bandwidth (RBW), or the time when an APD is measured in order to comply with a plurality of various standards.

The characteristics of the existing APD measurement apparatus are described below. The FFT type APD measurement apparatus disclosed in Patent Document 1 is advantageous in that the number of channels can be changed in response to the subject of measurement because an input signal is separated into frequency band components through an FFT operation, but is disadvantageous in that the time taken for processing is long because the computational load is increased in proportion to an increase of the number of channels. If the filter bank type APD measurement apparatus disclosed in Patent Document 2 is used, processing can be performed at high speed although the number of channels is increased because filters corresponding to respective frequency band components extract the frequency band components in parallel. In the filter bank type APD measurement apparatus, however, each of the filters can extract only a specific frequency band component. Thus, in order to extract all the corresponding frequency band components, the filter bank type APD measurement apparatus is problematic in that hardware elements constituting the apparatus are increased and complicated, and the costs are high. It makes it difficult to flexibly change the number of channels based on measurement conditions.

The FFT type APD measurement apparatus is also problematic in the accuracy of measurement. This is because, although Fourier Transform (FT) is a theoretical equation for performing an operation on the time from $-\infty$ to $\infty$, the operation is performed on an input signal within a limited range using a window function in an FFT for an actual high-speed calculation scheme. Accordingly, in order to secure the accuracy of measurement in the FFT type APD measurement apparatus, a standard for the subject of measurement is defined, measurement conditions, such as the number of channels or a resolution bandwidth (RBW), are fixed based on the standard, and tuning is previously performed. In the FFT type APD measurement apparatus, however, the measurement conditions are not generally changed.

Accordingly, the present invention has been made to solve the above problems, and it is an object of the present invention to provide an APD measurement apparatus, which realizes a construction composed of a plurality of channel groups, performs measurements for the channel groups at the same time, and reduces an increase of the processing time resulting from an increase of the number of channels, by jointly using FFT type frequency selection means and filter bank type frequency selection means. Furthermore, it is another object of the present invention to provide an APD measurement apparatus which is capable of measuring various subjects of measurement by changing measurement conditions, such as the number of channels or a resolution bandwidth (RBW). Furthermore, it is yet another object of the present invention to provide a general-purpose APD measurement apparatus which is capable of measuring various subjects of measurement and also enabling measurements with a higher accuracy of measurement by correcting an amplitude output by the FFT type frequency selection means in the case in which measurement conditions are changed.

To achieve the above objects, the present invention has taken notice of the control of the resolution bandwidth (RBW) or the number of channels through the control of the frequency of a sampling clock and of the correction of the output of an FFT type APD measurement apparatus using the output of a filter bank type APD measurement apparatus with a high accuracy of measurement.

According to an preferred embodiment of this invention, an amplitude probability distribution measurement apparatus comprising: a frequency analysis unit having Analog/Digital (A/D) conversion means for sampling an input signal, converting the input signal into digital data, and outputting the digital data and frequency selection means for extracting predetermined frequency band components to be measured from the digital data; a level detection unit for detecting an amplitude of each of the frequency band components to be measured which are acquired by the frequency analysis unit; and an amplitude probability distribution measurement unit for finding an amplitude probability distribution, which is a probability that an amplitude of each measurement frequency band component to be measured exceeds a predetermined threshold value, every lapse of time, wherein said frequency selection means comprises Fast Fourier Transform (FFT) type processing means forming a filter for extracting said frequency band components to be measured from the digital data through an FFT operation, filter bank type processing means which is composed of a plurality of filters for extracting said frequency band components from the digital data, and a selector for switching an output extracted from said FFT type processing means and an output extracted from said filter bank type processing means according to said frequency band components to be measured.

Preferably, the amplitude probability distribution measurement apparatus further comprises correction means for comparing amplitudes of the frequency band components to be measured, extracted by the FFT type processing means, and amplitudes of the frequency band components to be measured, extracted by the filter bank type processing means, and for correcting the amplitudes outputted by the FFT type processing means and generated when the FFT operation is performed based on a result of the comparison.

Preferably, the amplitude probability distribution measurement apparatus further comprises resolution bandwidth (RBW)/measurement channel control means including a clock generator for generating a clock signal, wherein the RBW/measurement channel control means changes a cycle of the clock signal generated by the clock generator and changes a resolution bandwidth when measurement is performed, a number of channels to be measured which is a number of measurement frequency band components, or said predetermined time when an amplitude probability distribution is measured by sending the clock signal to each of the A/D conversion means, the frequency selection means, and the amplitude probability distribution measurement unit.

Preferably, the RBW/measurement channel control means individually sets up a resolution bandwidth (RBW) when measurement is performed or a number of channels to be measured for each of the FFT type processing means and the filter bank type processing means.

According to another embodiment of this invention, an amplitude probability distribution measurement apparatus is provided which is comprising: a frequency analysis unit comprising A/D conversion means for sampling an input signal, converting the input signal into digital data, and outputting the digital data and FFT type frequency selection means for extracting frequency band components to be measured from the digital data using at least an FFT operation; a level detection unit for detecting an amplitude of each of the frequency band components to be measured, acquired by the frequency analysis unit; and an amplitude probability distribution measurement unit for finding an amplitude probability distribution, which is a probability that an amplitude of each measurement frequency band component to be measured exceeds a predetermined threshold value, every lapse of time, wherein the amplitude probability distribution measurement apparatus further comprises resolution bandwidth (RBW)/measurement channel control means including a clock generator for generating a clock signal, wherein the RBW/measurement channel control means changes a cycle of the clock signal generated by the clock generator and changes a resolution bandwidth when measurement is performed, a number of channels to be measured which is a number of measurement frequency band components, or said predetermined time when an amplitude probability distribution is measured by sending the clock signal to each of the A/D conversion means, the frequency selection means, and the amplitude probability distribution measurement unit.

According to this invention, there is provided an amplitude probability distribution measurement method comprising: an Analog/Digital (VD) conversion step for sampling an input signal, converting the input signal into digital data, and outputting the digital data; a frequency analysis step for frequency selecting to extract predetermined frequency band components to be measured from the digital data; a level detection step for detecting an amplitude of each of the frequency band components to be measured which are acquired by the frequency analysis step; and an amplitude probability distribution measurement step for finding an amplitude probability distribution, which is a probability that an amplitude of each measurement frequency band component to be measured exceeds a predetermined threshold value, every lapse of time, wherein said frequency selecting step comprises a Fast Fourier Transform (FFT) type processing step using a filter for extracting said frequency band components to be measured from the digital data through an FFT operation, filter bank type processing step using a plurality of filters for extracting said frequency band components from the digital data, and a switching step for switching an output extracted from said FFT type processing step and an output extracted from said filter bank type processing step according to said frequency band components to be measured.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 2 is a flowchart illustrating the operation of the APD measurement apparatus according to the first embodiment.

FIG. 5 is a graph illustrating the relationship between the amplitude and the frequency, for illustrating the correction of the APD measurement apparatus according to the first embodiment.

FIG. 7 is a flowchart illustrating the operation of the APD measurement apparatus according to the modified embodiment 2 of the first embodiment.

DETAILED DESCRIPTION OF EXEMPLARY EMBODIMENTS (First Embodiment)

Figure 1:
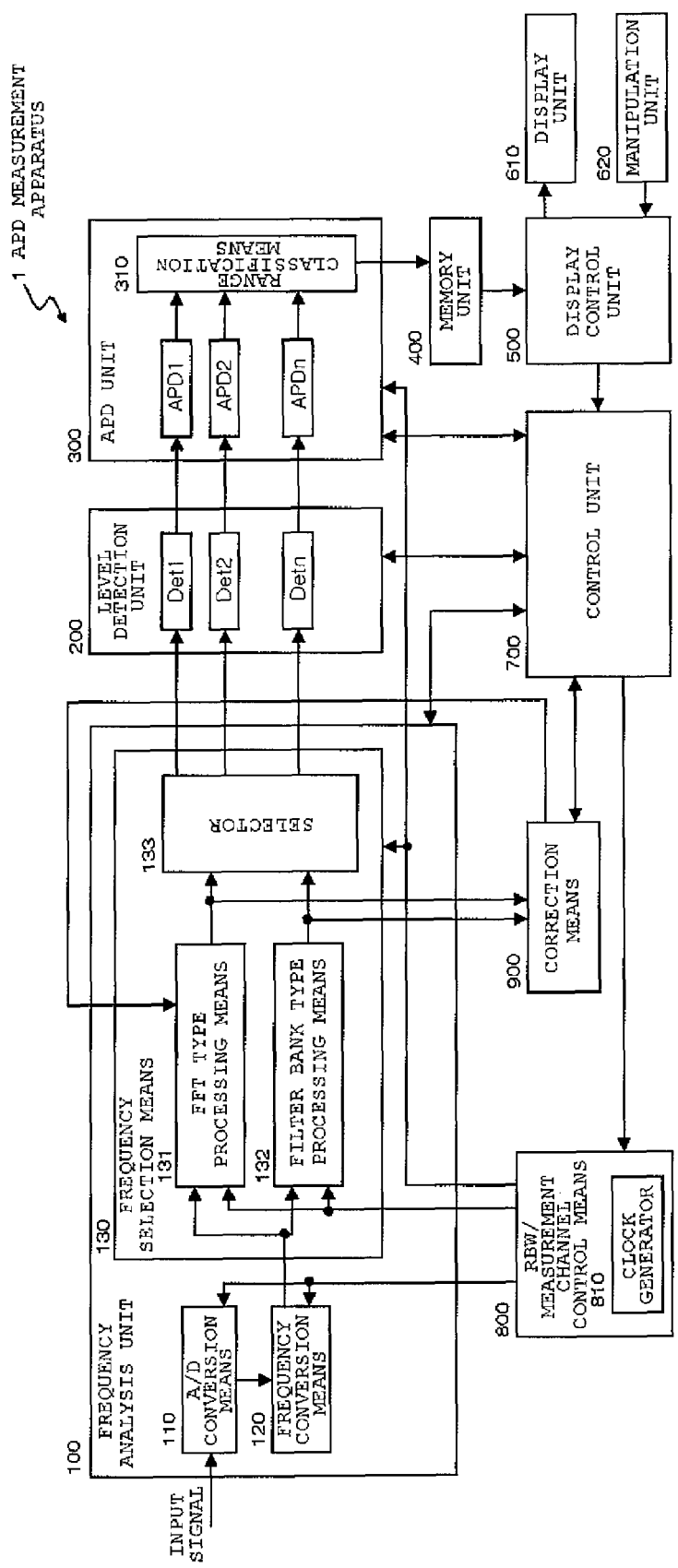
FIG. 1 is a functional block diagram of an APD measurement apparatus according to a first embodiment of the present invention.

Some embodiments of the present invention will now be described in detail with reference to the accompanying drawings. A construction and operations are described below in order of the operation with reference to FIGS. 1 and 2.

Measurement of an APD
Set-up of measurement conditions
Correction of the measurement apparatus
(Measurement of APD)

Figure 2A:
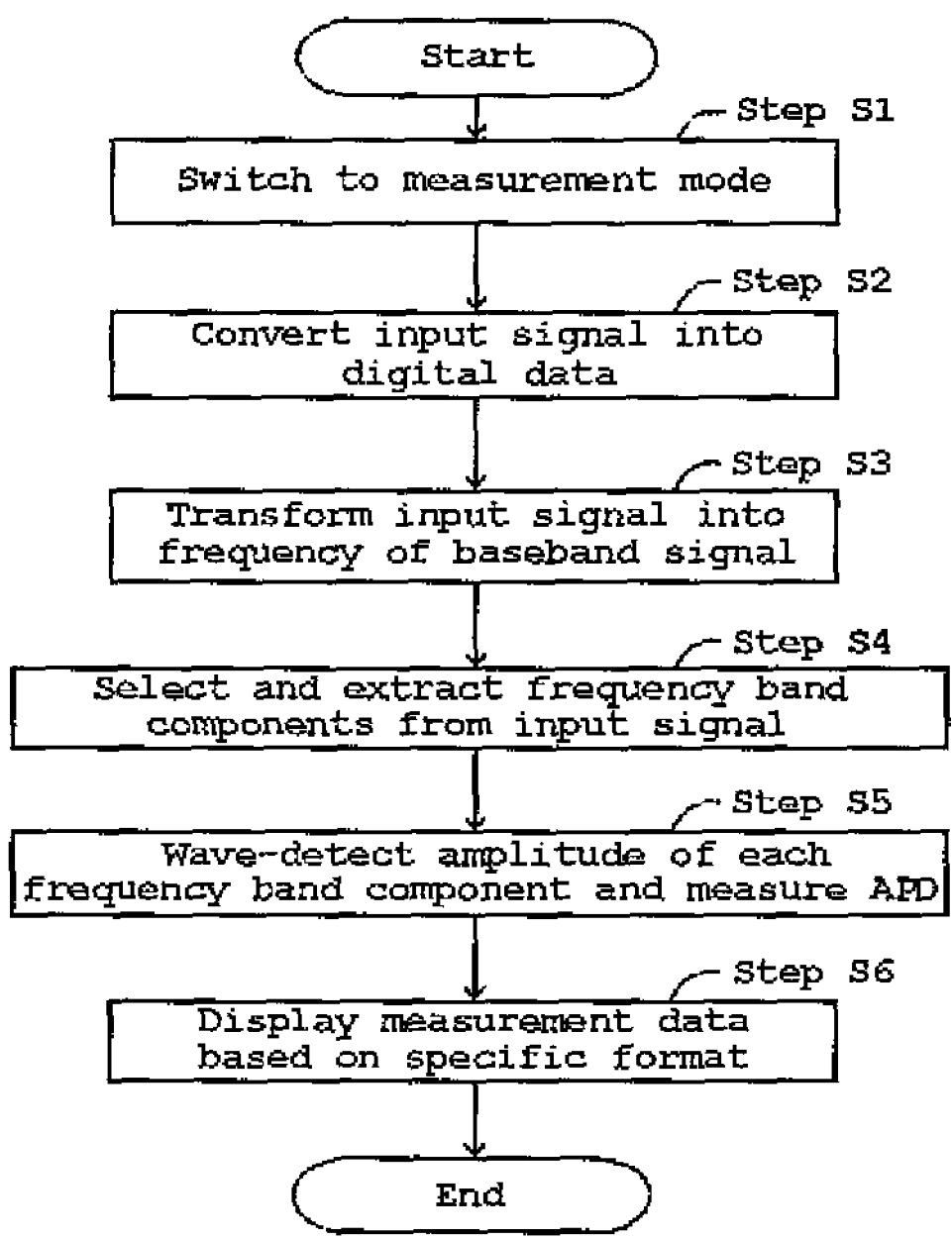
FIG. 2(a) is a flowchart illustrating an operation of measuring an APD.

First, the measurement of an APD is described below with reference to FIG. 2(a). FIG. 2(a) is a flowchart illustrating a series of processing relating to the measurement of an APD.

(Step S1)

An APD measurement apparatus according to the present embodiment includes operation modes, including a measurement mode in which an APD is measured and a correction mode in which equipment is corrected. A control unit 700 manages the state of the measurement apparatus and switches the operation mode. In the case in which an APD is measured, the control unit 700 switches the operation mode to the measurement mode.

The control unit 700 switches the operation mode to the measurement mode and inputs a signal to be measured (i.e., an input signal) to a frequency analysis unit 100. The frequency analysis unit 100 includes Analog/Digital (A/D) conversion means 110, frequency conversion means 120, and frequency selection means 130. The A/D conversion means 110 receives the input signal (i.e., the signal to be measured) and converts the input signal into digital data. The frequency conversion means 120 converts the input signal, converted into the digital data, into a baseband signal. The frequency selection means 130 selects a signal to be used as a measurement point, corresponding to a plurality of different predetermined frequency bands, from the input signal converted into the digital data by the A/D conversion means 110 and the frequency conversion means 120. The frequency analysis unit 100 analyzes the input signal and extracts the frequency band components from the input signal based on measurement conditions.

(Step S2)

An internal construction of the frequency analysis unit 100 is described in detail below. The signal (i.e., the subject of measurement), inputted to the frequency analysis unit 100, is inputted to the A/D conversion means 110 as an input signal. The A/D conversion means 110 receives the input signal, samples the input signal into a frequency fad in response to a clock signal generated by RBW/measurement channel control means 800, and converts the input signal into digital data. The RBW/measurement channel control means 800 is described in detail later.

(Step S3)

The input signal, converted into the digital data by the A/D conversion means 110, is inputted to the frequency conversion means 120. The frequency conversion means 120 converts the input signal, converted into the digital data by the A/D conversion means 110, from an Intermediate Frequency (IF) band signal to a dedicated-line access system signal in response to the clock signal of a frequency fddc generated by the RBW/measurement channel control means 800 and also converts the input signal into I, Q signals at a low sampling rate according to a band processed by the frequency selection means 130. If, as described above, a signal is converted at a low sampling rate using the frequency conversion means 120, consumption power can be reduced.

(Step S4)

Next, the frequency selection means 130 extracts frequency band components (i.e., the subject of measurement) from the digital data of the I, Q signals, converted into the base band signal by the frequency conversion means 120. The frequency selection means 130 includes FFT type processing means 131 for extracting a signal of a specific frequency through FFT and filter bank type processing means 132 for extracting a signal of a predetermined and specific frequency using each of filters arranged in parallel. One of or both the FFT type processing means 131 and the filter bank type processing means 132 select and extract frequency band components, designated by the RBW/measurement channel control means 800, from the input signal converted into the digital data. A selector 133 selects one of or both the frequency band components extracted by the FFT type processing means 131 and the filter bank type processing means 132 and outputs the selected frequency band components (i.e., the subject of measurement) under the control of the RBW/measurement channel control means 800.

The internal construction of the frequency selection means 130 is described in more detail below. The FFT type processing means 131 receives the output of the frequency conversion means 120 and extracts a resolution bandwidth RBW and each frequency band component in the FFT type processing means 131 from the input signal, converted into the digital data, by performing an FFT operation processing on the received output in response to a clock signal (of a frequency fft) generated by the RBW/measurement channel control means 800. Such an operation is possible because the frequency fft of the clock signal is set up on the basis of the resolution bandwidth $RBW_{ft}$ in the FFT type processing means 131, the number of frequency band components $n_{ft}$ in the FFT type processing means 131, and the number of data necessary to measure an APD for each of the frequency band components. The frequency fft of the clock signal is described in detail later.

The filter bank type processing means 132 receives the output of the frequency conversion means 120, inputs the received output to each of the filters within a filter bank, and extracts a predetermined frequency band component, corresponding to each of the filters within the filter bank, from the input signal converted into the digital data.

The selector 133 receives the frequency band components extracted by the FFT type processing means 131 and the filter bank type processing means 132. When setting up measurement conditions, the selector 133 selects and outputs one of or both the frequency band components, required to calculate an APD and extracted by the FFT type processing means 131 and the filter bank type processing means 132, based on the measurement conditions set up by the RBW/measurement channel control means 800.

A conversion example of the selector 133 is described below based on an example shown in FIG. 3.

Figure 3A:
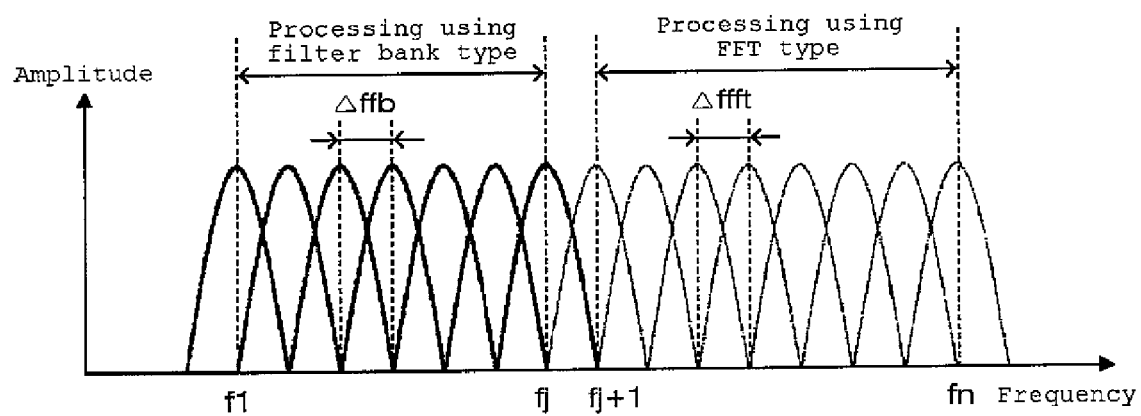
FIG. 3 is an auxiliary diagram illustrating an example of frequency band components (i.e., the subject of measurement) and the assignment of a method of extracting each frequency band component.
Figure 3B:
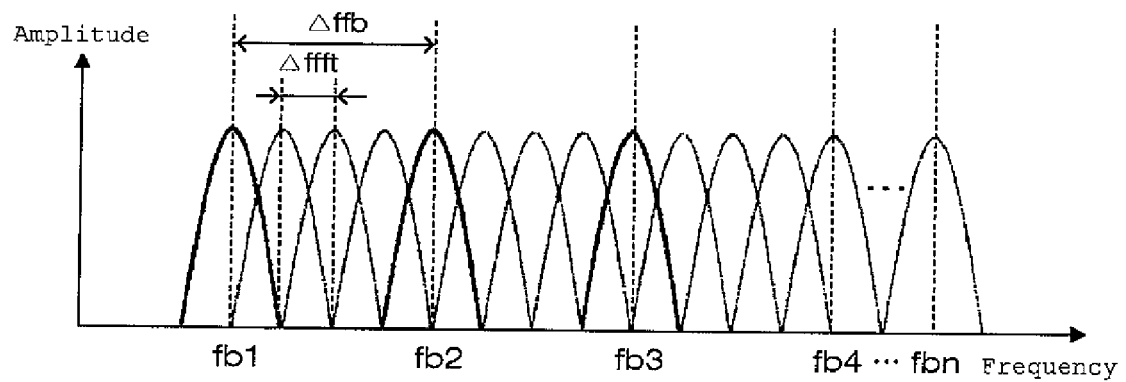

FIG. 3 is an auxiliary diagram illustrating an example of the assignment of a method of extracting the frequency band components of the subject of measurement and each of the frequency band components. For example, as shown in FIG. 3(*a*), in the case in which the filter bank type processing means acquires frequency band components from f1 to fj and the FFT type processing means acquires frequency band components from fj+1 to fn, the selector 133 outputs frequency band components, extracted by the filter bank type processing means 132, as the frequency band components from f1 to fj and outputs frequency band components, extracted by the FFT type processing means 131 as the frequency band components from fj+1 to fn. If a frequency region is divided and the FFT type processing means 131 and the filter bank type processing means 132 are switched as described above, an optimal channel configuration is made possible. Accordingly, in a configuration with a less number of channels, the number of FFT operation processings can be reduced using the form of a filter bank.

Furthermore, as shown in FIG. 3(*b*), the extraction of frequency band components fb1, fb2, . . . , fbn using the filter bank type processing means 132 and the acquisition of frequency band components between the frequency band components, such as fb2−1 from fb1+1 and fb3−1 from fb2+1, using the FFT type processing means 131 in the form of a filter bank depending on the requirements of an operator can be achieved by controlling the frequency of the clock signals, generated by the RBW/measurement channel control means 800 and inputted to the A/D conversion means 110, the frequency conversion means 120, the FFT type processing means 131, and the filter bank type processing means 132.

(Step S5)

The frequency band components extracted by the frequency selection means 130 are inputted to a level detection unit 200 for every frequency band component. The level detection unit 200 includes n wave detectors Det1 to Detn (hereinafter referred to as 'Det1 to Detn'). The Det1 to Detn multiply the respective frequency band components of the I, Q signals, extracted by the frequency selection means 130, perform logarithmic transformation for the amplitudes (for example, power values) of the frequency band components using LOG transform means (not shown), and outputs corresponding results.

An APD unit 300 is a measurement unit for measuring an APD based on the amplitude values log-transformed and output by the level detection unit 200. The APD unit 300 includes individual APD1 to APDn (hereinafter referred to as 'APD1 to APDn') and range classification means 310.

The individual APD1 to APDn measure an APD by calculating the number of occurrences of the amplitude values, sampled by the A/D conversion means 110 and inputted on a predetermined time with a unit less than the accuracy of quantization, measures the number of occurrences at specific time intervals, calculates the measured number of occurrences as the frequency number of appearances. Meanwhile, the measurement of an APD (i.e., the measurement of an APD) is described in detail in Patent Document 2. For the measurement of an APD, reference can be made to Patent Document 2.

Figure 4:
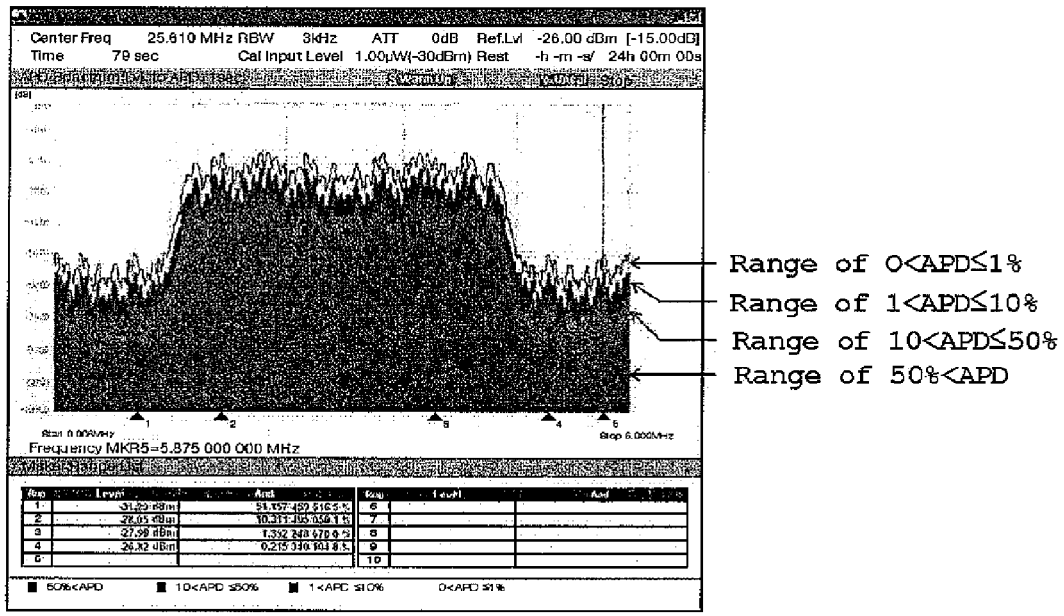
FIG. 4 shows an example of displaying the measurement results of an APD.

The range classification means 310 classifies the data of the APD, measured by the APD1 to APDn, for every predetermined range. Information is assigned to each of the classified ranges, and the pieces of information are displayed when the results of measurement are displayed. FIG. 4 shows an example in which the frequency band component of 25.610 MHz is measured with the resolution bandwidth of 3 kHz, the data of an APD are classified into 0<APD≦1%, 1<APD≦10%, 10<APD≦50%, and 50%<APD, the amplitude is assigned to the vertical axis, the frequency is assigned to the horizontal axis, and the classified measurement results are displayed in the form of color bars.

(Step S6)

The APD measured by the APD unit 300 is stored in a memory unit 400. A display control unit 500 controls data stored in the memory unit 400 so that the data are displayed in a display unit 610 based on a format designated by the manipulation of an operator through a manipulation unit 620.

Meanwhile, the construction in which the frequency selection means 130 includes both the FFT type processing means 131 and the filter bank type processing means 132, switched by the selector 133, has been described above. Instead of both the processing means, the frequency selection means 130 may include either FFT type frequency selection means 131 for extracting frequency band components (i.e., the subject of measurement) from digital data using an FFT operation or filter bank type frequency selection means 132 configured to include a plurality of filters for extracting predetermined frequency band components from an input signal and configured to extract frequency band components (i.e., the subject of measurement) from digital data.

In the case in which the frequency selection means 130 includes only the filter bank type frequency selection means 132, since frequency band components (i.e., the subject of measurement) are limited by the filters mounted on a filter bank, a change in the number of channels (i.e., the subject of measurement) is limited to a range corresponding to a group of mounted filters.

Furthermore, in the case in which the frequency selection means 130 includes the FFT type frequency selection means 131 or the filter bank type frequency selection means 132, the correction of the measurement apparatus which is described later cannot be performed.

(Set-Up of Measurement Conditions)

Figure 2B:
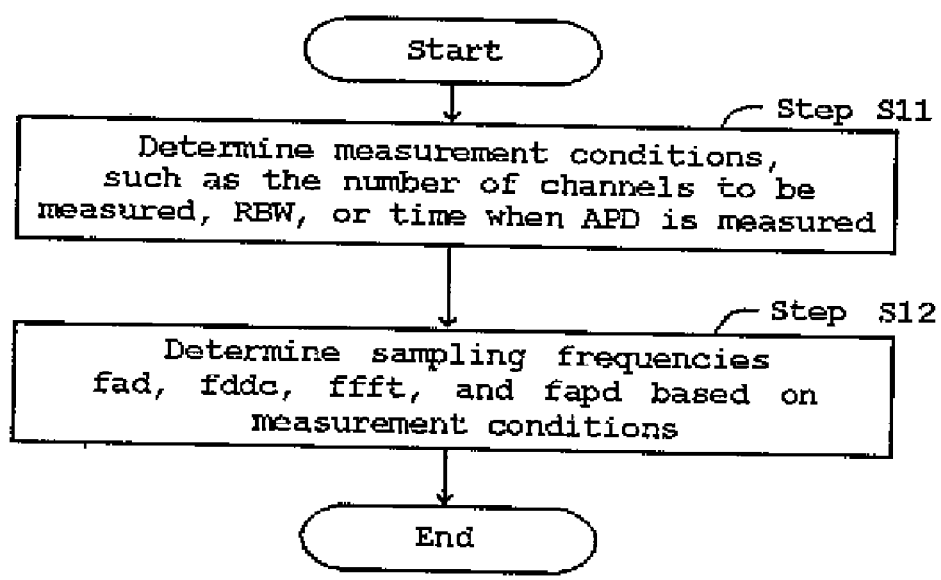
FIG. 2(b) is a flowchart illustrating an operating of setting up measurement conditions.

The set-up of measurement conditions is described below with reference to FIG. 2(*b*). FIG. 2(*b*) is a flowchart illustrating a series of operations for setting up measurement conditions. In the case in which the set-up of measurement conditions is changed, the RBW/measurement channel control means 800 sets up the measurement conditions in the frequency analysis unit 100 and the APD unit 300 based on information, inputted by an operator (hereinafter referred to as 'input information') through the manipulation unit 620, in order to determine internal parameters for the operation of the apparatus.

(Step S11)

The RBW/measurement channel control means 800 receives an instruction for setting up the measurement conditions from the control unit 700, determines the measurement conditions, such as the number of channels n, a resolution bandwidth (RBW), or the measurement time T of an APD based on the input information, and sets up the measurement conditions in the frequency analysis unit 100 and the APD unit 300. Here, the RBW/measurement channel control means 800 assigns each of the measurement frequency band components to any one of the FFT type processing means 131 and the filter bank type processing means 132 based on the set-up measurement conditions.

Furthermore, the RBW/measurement channel control means 800 calculates the number of frequency band components $n_{ffr}$ (hereinafter referred to as 'the number of channels $n_{ffr}$') of the FFT type processing means 131, which is necessary to measure the frequency band components assigned to the FFT type processing means 131. Here, the number of channels n of the FFT type processing means 131 is set to the number of the frequency band components or more, assigned to the FFT type processing means 131. Furthermore, a resolution bandwidth $RBW_{fft}$ ($RBW_{fft}=\Delta ffft$) is calculated from an interval $\Delta ffft$ between the frequency band components assigned to the FFT type processing means 131.

(Step S12)

Next, the RBW/measurement channel control means 800 calculates the frequencies fad, fddc, ffft, and fapd of clock signals (i.e., internal parameters for the operation of the apparatus) for acquiring data using the A/D conversion means 110, the frequency conversion means 120, the FFT type processing means 131, and, the APD unit 300. The frequency fad is the frequency of a clock signal for sampling digital data from an input signal received from the A/D conversion means 110. The frequency fddc is the frequency of a clock signal for converting the rate of the sampling data using the frequency conversion means 120. The frequency ffft is the frequency of a clock signal for extracting predetermined frequency band components from the input signal, converted into the digital data, using the FFT type processing means 131. The frequency fapd is the frequency of a clock signal for acquiring data used to calculate the APD using the APD unit 300.

(Set-Up of Frequency of Clock Signal)

The RBW/measurement channel control means 800 first sets up the frequency fapd of the clock signal, inputted to the APD unit 300, by calculating the number of data which are sampled while passing through the resolution bandwidth $RBW_{fft}$, set up the FFT type processing means 131, and the resolution bandwidth $RBW_{fft}$ through which a signal (i.e., the subject of measurement) passes using a multiplier $m_{apd}$. Here, the multiplier $m_{apd}$ needs to be set to 10 or more. This is because, if the multiplier $m_{apd}$ is not sufficiently secured, a characteristic point, including the peak of a signal, cannot be sufficiently detected. An equation for calculating the frequency fapd is shown below. The APD unit 300 is described in detail later.

$$fapd=RBW_{fft}*m_{apd} \quad \text{[Equation 1]}$$

Next, the RBW/measurement channel control means 800 sets up the frequency ffft of the clock signal, inputted to the FFT type processing means 131, based on the frequency fapd and the number of channels n assigned to the FFT type processing means 131. The FFT type processing means 131 extracts frequency band components from the input signal, converted into the digital data, using an FFT operation in response to the corresponding clock signal. In this case, to accurately sample the frequency band components, it is necessary to sample each of the frequency band components at a frequency which is more than twice the frequency fapd. An equation for calculating the frequency ffft is shown below. The FFT type processing means 131 is described in detail later.

$$ffft=fapd*n_{fft}*2=RBW_{fft}*m_{apd}*n_{fft}*2 \quad \text{[Equation 2]}$$

Next, the RBW/measurement channel control means 800 sets up the frequency fddc of the clock signal, inputted to the frequency conversion means 120, based on the frequency ffft. The frequency conversion means 120 converts the sampling rate of the input signal, converted into the digital data, in response to the corresponding clock signal. To accurately acquire data using the FFT type processing means 131, it is necessary to set up the fddc≧ffft more than the frequency ffft in the frequency fddc. In particular, in the case in which the FFT operation of the FFT type processing means 131 is divided into the singular numbers K and performed, sampling into a frequency K*ffft is required, and the sampling is processed using the frequency fddc. The frequency conversion means 120 is described in detail later.

Next, the RBW/measurement channel control means 800 sets up the frequency fad of the clock signal, inputted to the A/D conversion means 110, based on the frequency fddc. The A/D conversion means 110 samples the input signal in response to the corresponding clock signal and converts the input signal into digital data. To accurately convert the signal using the frequency conversion means 120, it is necessary to set up the frequencies fad to fddc more than the frequency fddc in the frequency fad. The A/D conversion means 110 is described in detail later.

The relationship between the frequencies fad, fddc, ffft, and fapd of the clock signals can be expressed in the following equation.

$$fad \geq fddc \geq ffft = fapd*n_{fft}*2 \geq fapd = RBW_{fft}*m_{apd} \quad \text{[Equation 3]}$$

Meanwhile, when the RBW/measurement channel control means 800 sends the clock signals to the A/D conversion means 110, the frequency conversion means 120, the FFT type processing means 131, and the APD unit 300, respectively, based on the calculated frequencies fad, fddc, ffft, and fapd, each of the A/D conversion means 110, the frequency conversion means 120, the FFT type processing means 131, and the APD unit 300 acquires necessary data based on the measurement conditions.

(Correction of Measurement Apparatus)

Figure 2C:
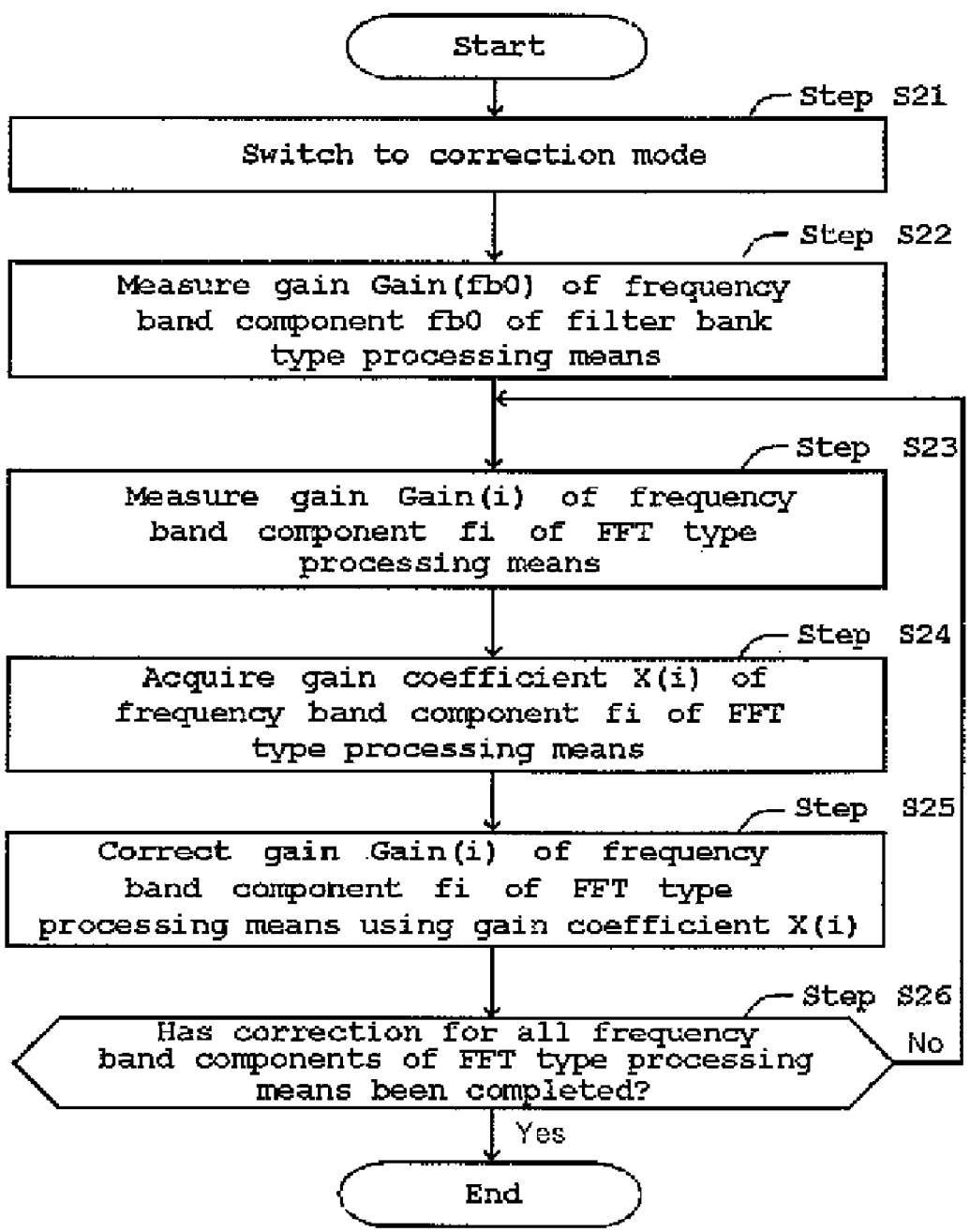
FIG. 2(c) is a flowchart illustrating an operation of correcting the measurement apparatus.
Figure 5A:
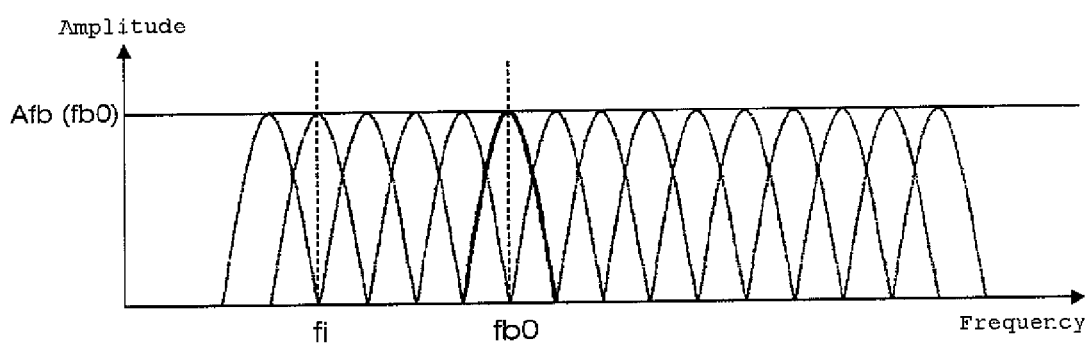
FIG. 5(a) is a graph illustrating the characteristic of filter bank type processing means.
Figure 5B:
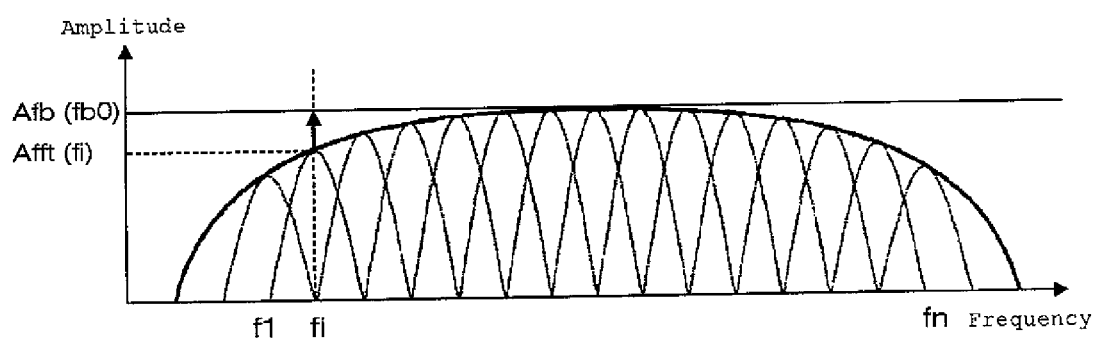
FIG. 5(b) is a graph illustrating the characteristic of FFT type processing means.

The correction of the measurement apparatus is described below with reference to FIGS. 2(c) and 5. FIG. 2(c) is a flowchart illustrating a series of operations of correcting the measurement apparatus. Furthermore, FIG. 5(a) is a graph showing a characteristic relating to the relationship between the frequency and the amplitude for the filter bank type processing means 132. FIG. 5(b) is a graph showing a characteristic relating to the relationship between the frequency and the amplitude for the FFT type processing means 131.

If the gains of the FFT type processing means 131 and the filter bank type processing means 132 are controlled such that a signal having a constant amplitude (for example, the frequency component Afb(fbO) in FIG. 5(a)) is output from an input signal having a predetermined amplitude without being limited to frequency band components as in the characteristic of the filter bank type processing means 132 shown in, for example, FIG. 5(a), an amplitude with a high accuracy can be obtained. However, in the case in which the FFT type processing means 131 is used as in FIG. 5(b), the level of a signal (the gain of the filter) output by the frequency band components is changed. A change in the level of the signal is generated because of error in the FFT operation. Although Fourier Transform (FT) is a theoretical equation for performing an operation on the time from −∞ to ∞, the operation is performed on an input signal within a limited range using a window function in an FFT for an actual high-speed calculation scheme, resulting in the generation of error. Error generated in the gain (amplitude) of the frequency selection means 130 (in particular, the FFT type processing means 131) within the frequency analysis unit 100 is corrected based on a comparison between the corresponding gain and the gain (amplitude) of the filter bank type processing means 132 with a high accuracy of measurement. Accordingly, the correction of the measurement apparatus is chiefly performed when conditions for an FFT operation are changed (that is, measurement conditions are changed).

(Step S21)

In the case in which the correction of the measurement apparatus is performed, the control unit 700 switches the operation mode to the correction mode and starts the correction of the FFT type processing means 131. Such correction is performed by correction means 900.

(Step S22)

The correction means 900 first finds the gain of the filter bank type processing means 132 which is a criterion for correction. In the case in which the gain is found using the filter of the frequency fb0 in the filter bank type processing means 132, a correction signal, having a predetermined amplitude Ain(fbO) and the frequency band component of a frequency fb0 (hereinafter referred to as a 'frequency band component fb0 '), is inputted to the A/D conversion means 110 as an input signal to the measurement apparatus. Next, an amplitude Afb(fbO) of the frequency band component fb0 of the filter bank type processing means 132 is measured, and a gain $Gain_{fb}$(fbO) of the filter bank type processing means 132 is calculated from the amplitudes Ain(fbO) and Afb(fbO). An equation for calculating the gain $Gain_{fb}$(fbO) is shown below.

$$Gain_{fb}(fb0) = \frac{Afb(fb0)}{Ain(fb0)} \qquad \text{[Equation 4]}$$

Next, the correction processing is performed on the FFT type processing means 131. The correcting processing for the FFT type processing means 131 is performed for every frequency band component. The frequency band component of a frequency fi (hereinafter referred to as a 'frequency band component fi') is described below as an example.

(Step S23)

The correction means 900 inputs a correction signal, having a predetermined amplitude Ain(fi) and the frequency band component fi, to the measurement apparatus as an input signal to the measurement apparatus, measures an amplitude Afft(fi) of the frequency band component fi of the FFT type processing means 131, and calculates a gain $Gain_{fft}$(fi) in the frequency band component fi of the FFT type processing means 131 from the amplitudes Ain(fi) and Afft(fi). An equation for calculating the gain $Gain_{fft}$(fi) is shown below.

$$Gain_{fft}(fi) = \frac{Afft(fi)}{Ain(fi)} \qquad \text{[Equation 5]}$$

(Step S24)

Next, the correction means 900 calculates a gain coefficient α(fi) of the frequency band component fi by comparing the gain $Gain_{fi}$(fi) and the gain $Gain_{fb}$(fbO). An equation for calculating the gain coefficient α(fi) is shown below.

[Equation 6]

$$\alpha(fi) = \frac{Gain_{fb}(fb0)}{Gain_{fft}(fi)} \qquad \qquad \text{A(A)}$$

$$= 1 - \frac{Gain_{fft}(fi) - Gain_{fb}(fb0)}{Gain_{fft}(fi)} \qquad \text{A(B)}$$

(Step S25)

The correction means 900 corrects the gain $Gain_{fft}$(fi) in the frequency band component fi of the FFT type processing means 131 based on the calculated gain coefficient α(fi). In other words, the gain $Gain_{fft}$(fi) obtained by performing an operation on the FFT type processing means 131 is output as α(fi)*$Gain_{fft}$(fi). A gain Gain(fi) of the frequency band component fi after correction is calculated using the following equation. Meanwhile, which one of A and B will be used as the equation for calculating the gain coefficient α(fi) depends on the processing construction of an FFT operation.

$$Gain(fi) = \alpha(fi) * Gain_{fft}(fi) \qquad \text{[Equation 7]}$$

On the other hand, in the case in which correction is performed with the amplitudes of the input signals Ain(fbO) and Ain(fi) remained constant (i.e., Ain(fbO)=Ain(fi)), the gain coefficient α(fi) may be calculated using the amplitudes Afft (fi) and Afft(fi) through the following equation.

[Equation 8]

$$\alpha(fi) = \frac{Afb(fb0)}{Afft(fi)} \qquad \qquad \text{A(A')}$$

$$= 1 - \frac{Afft(fi) - Afb(fb0)}{Afft(fi)} \qquad \text{A(B')}$$

(Step S26)

After the correction process for the frequency band component fi is completed, the correction means 900 performs the correction processing on the next frequency band component (No at step S26). After the correction processing for all the frequency band components is completed (Yes at step S26), the correction processing is finished. Next, in the case in which the above-described APD measurement operation has been performed, the FFT type processing means 131 outputs results based on the corrected gain Gain(fi).

Meanwhile, the series of operations performed by the APD measurement apparatus are controlled by the control unit 700. When an APD is measured, the control unit 700 instructs the frequency analysis unit 100 to analyze the input signal and also the level detection unit 200 and the APD unit 300 to measure the APD. Furthermore, when correction for the measurement apparatus is performed, the control unit 700 instructs the frequency analysis unit 100 to send the output data of the FFT type processing means 131 and the output data of the filter bank type processing means 132 to the correction means 900 and also instructs the correction means 900 to correct the measurement apparatus.

As described above, the frequency selection means 130 includes both the FFT type processing means 131 and the filter bank type processing means 132, and the cycles of the clock signal inputted to the A/D conversion means 110, the frequency selection means 130, or the APD unit 300 is changed. Accordingly, measurement conditions, such as a resolution bandwidth (RBW) or the number of channels, can be flexibly changed according to a user's needs.

Furthermore, the gain (amplitude) of the FFT type processing means is corrected using the gain (amplitude) of the filter bank type processing means having a high accuracy of measurement. Accordingly, a high accuracy of measurement is possible even in the frequency band components obtained by the FFT type processing means 131.

By combining the characteristics of the APD measurement apparatus according to the present embodiment (for example, by correcting the measurement apparatus when measurement conditions are changed), the measurement conditions can be flexibly changed generally, and a high accuracy of measurement is also made possible in the same in which measurement is performed using the filter bank type processing means.

(Modified Embodiment 1)

A modified embodiment 1 of the APD measurement apparatus relating to the above-described embodiment is described below with reference to FIGS. 2(a) and 3(c). FIG. 3 is an auxiliary diagram illustrating the assignment of a method of extracting each frequency band component and the set-up of measurement conditions in the modified embodiment 1.

An APD measurement apparatus relating to the modified embodiment 1 can inequally set up channel intervals by setting up different conditions (i.e., measurement conditions, such as the number of channels (i.e., the number of frequency band components to be measured) or a resolution bandwidth (RBW)) for the FFT type processing means 131 and the filter bank type processing means 132.

Figure 3C:
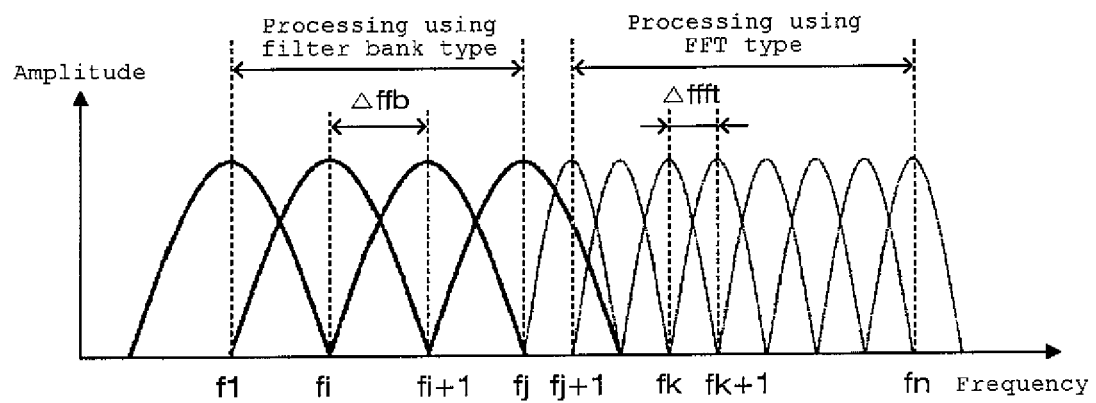

In the example of FIG. 3(c), the measurement conditions are set up in such a manner that the frequency band components ranging from the frequency f1 to the frequency fj are assigned to the filter bank type processing means 132, the frequency band components ranging from the frequency fj+1 to the frequency fn are assigned to the FFT type processing means 131, and a channel interval Δffb in the filter bank type processing means 132 and an interval Δffft between the frequency band components in the FFT type processing means 131 have a relationship of Δffb>Δffft. The operation of the APD measurement apparatus relating to the modified embodiment 1 is described below based on the example shown in FIG. 3(c).

A series of operations for setting up measurement conditions in the APD measurement apparatus relating to the modified embodiment 1 are described below with reference to the flowchart of FIG. 2(a). Meanwhile, a series of operations for measuring an APD or correcting the measurement apparatus in the APD measurement apparatus relating to the modified embodiment 1 are identical with those of the APD measurement apparatus according to the first embodiment, and a detailed description thereof is omitted.

(Set-Up of Measurement Conditions)

To determine internal parameters necessary for measurement conditions or the operation of an apparatus, the RBW/measurement channel control means 800 sets up the measurement conditions for the frequency analysis unit 100 and the APD unit 300 based on information inputted by an operator (hereinafter referred to as 'input information') through the manipulation unit 620.

(Step S1)

The RBW/measurement channel control means 800 receives an instruction to set up measurement conditions from the control unit 700, determines the measurement conditions, such as the number of channels nfb and the resolution bandwidth $RBW_{fb}$ of the filter bank type processing means 132, the number of channels n and the resolution bandwidth $RBW_{ft}$ of the FFT type processing means 131, and the measurement time T of an APD based on the input information, and sets up the measurement conditions for the frequency analysis unit 100 and the APD unit 300.

Furthermore, the RBW/measurement channel control means 800 assigns each of frequency band components (i.e., the subject of measurement) to any one of the FFT type processing means 131 and the filter bank type processing means 132 based on the set-up measurement conditions. In the example shown in FIG. 3(c), it is illustrated that the frequency band components ranging from the frequency f1 to the frequency fj are assigned to the filter bank type processing means 132, and the frequency band components ranging from the frequency fj+1 to the frequency fn are assigned to the FFT type processing means 131.

(Step S2)

The RBW/measurement channel control means 800 calculates the frequencies fad, fddc, ffft, and fapd of clock signals (i.e., internal parameters for the operation of the apparatus) for acquiring data using the A/D conversion means 110, the frequency conversion means 120, the FFT type processing means 131, and the APD unit 300. This is the same as the first embodiment. In the APD measurement apparatus relating to the modified embodiment 1, however, the RBW/measurement channel control means 800 further calculates the frequency ffb of a clock signal for acquiring data using the filter bank type processing means 132. The method of calculating the frequencies ffft and fapd is the same as that of the APD measurement apparatus relating to the first embodiment, and a detailed description thereof is omitted.

In the same manner as for the FFT type processing means 131, the frequency ffb is calculated by calculating the frequency $fapd_{fb}$ of a clock signal inputted to the APD unit 300 when processing is performed using the filter bank type processing means 132 from the resolution bandwidth $(RBW)_{fb}$ of the filter bank type processing means 132 and the number of data mapd which are sampled through the resolution bandwidth $(RBW)_{fb}$, and using the calculated frequency $fapd_{fb}$ and the number of channels $n_{fb}$ of the filter bank type processing means 132. An equation for calculating the frequency ffb is shown below.

$$ffb = fapd_{fb} * n_{fb} * 2 = RBW_{fb} * m_{apd} * n_{fb} * 2 \quad \text{[Equation 9]}$$

Meanwhile, the frequencies fad and fddc of the clock signals inputted to the A/D conversion means 110 and the frequency conversion means 120 need to be sampled with a high frequency as compared with any one of the frequencies ffft and fb. An equation for calculating the frequencies fad and fddc is shown below.

$$fad \geq fddc \geq ffft \,(\text{in case of } ffft \geq ffb)$$

$$fad \geq fddc \geq ffb \,(\text{in case of } ffft < ffb) \quad \text{[Equation 10]}$$

The APD measurement apparatus relating to the modified embodiment 1 can change a channel interval measured for every frequency band because the FFT type processing means 131 and the filter bank type processing means 132 separately process the frequency band components of different ranges and different resolution bandwidths are set up for the FFT type processing means 131 and the filter bank type processing means 132. Accordingly, since measurement conditions are separately measured for respective frequencies with different channel intervals, unnecessary frequency band components need not to be measured, and so measurement with a high efficiency can be performed.

(Modified Embodiment 2)

Figure 6:
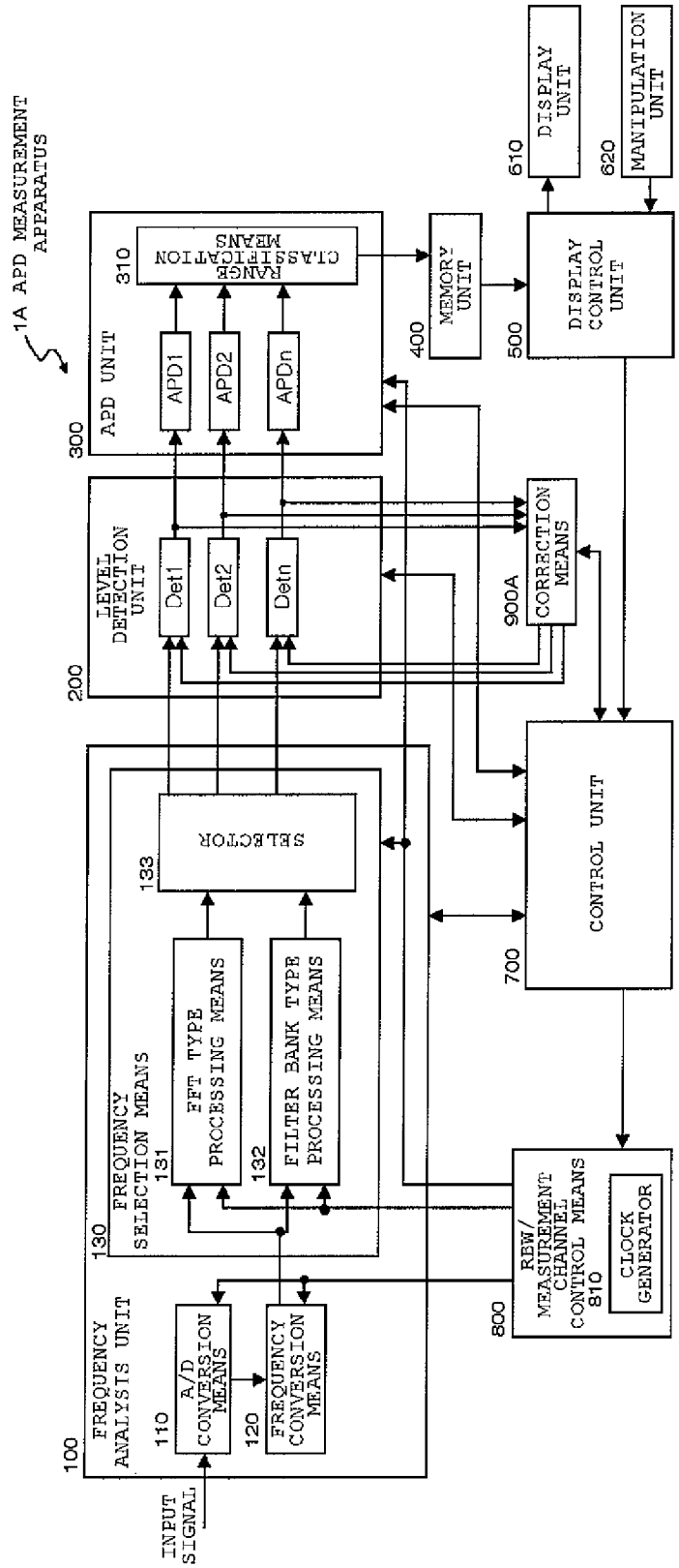
FIG. 6 is a functional block diagram of an APD measurement apparatus according to a modified embodiment 2 of the first embodiment.

A modified embodiment 2 of the APD measurement apparatus relating to the above-described embodiments is described below with reference to FIGS. 6 and 7. FIG. 6 is a functional block diagram of an APD measurement apparatus according to the modified embodiment 2 of the first embodiment. FIG. 7 is a flowchart illustrating the operation of the APD measurement apparatus according to the modified embodiment 2 of the first embodiment. A construction and operations are described below in order of the operation with reference to FIGS. 1 and 2.

Set-up of measurement conditions
Set-up of a correction efficient
Measurement of an APD Meanwhile, the operation of setting up measurement conditions is identical with that of the APD measurement apparatus relating to the first embodiment, and a detailed description thereof is omitted.

To improve the accuracy of measurement through correction of the measurement apparatus, the APD measurement apparatus relating to the modified embodiment 2 is configured to include correction means 900A, instead of the correction means 900 of the above embodiments, and to receive amplitudes wave-detected by wave detectors Det1 to Detn and correct the amplitudes wave-detected by the wave detectors Det1 to Detn (in particular, the amplitudes of frequency band components assigned to FFT type processing means 131) based on the amplitudes of frequency band components assigned to filter bank type processing means 132.

(Set-Up of Correction Efficient)

Figure 7A:
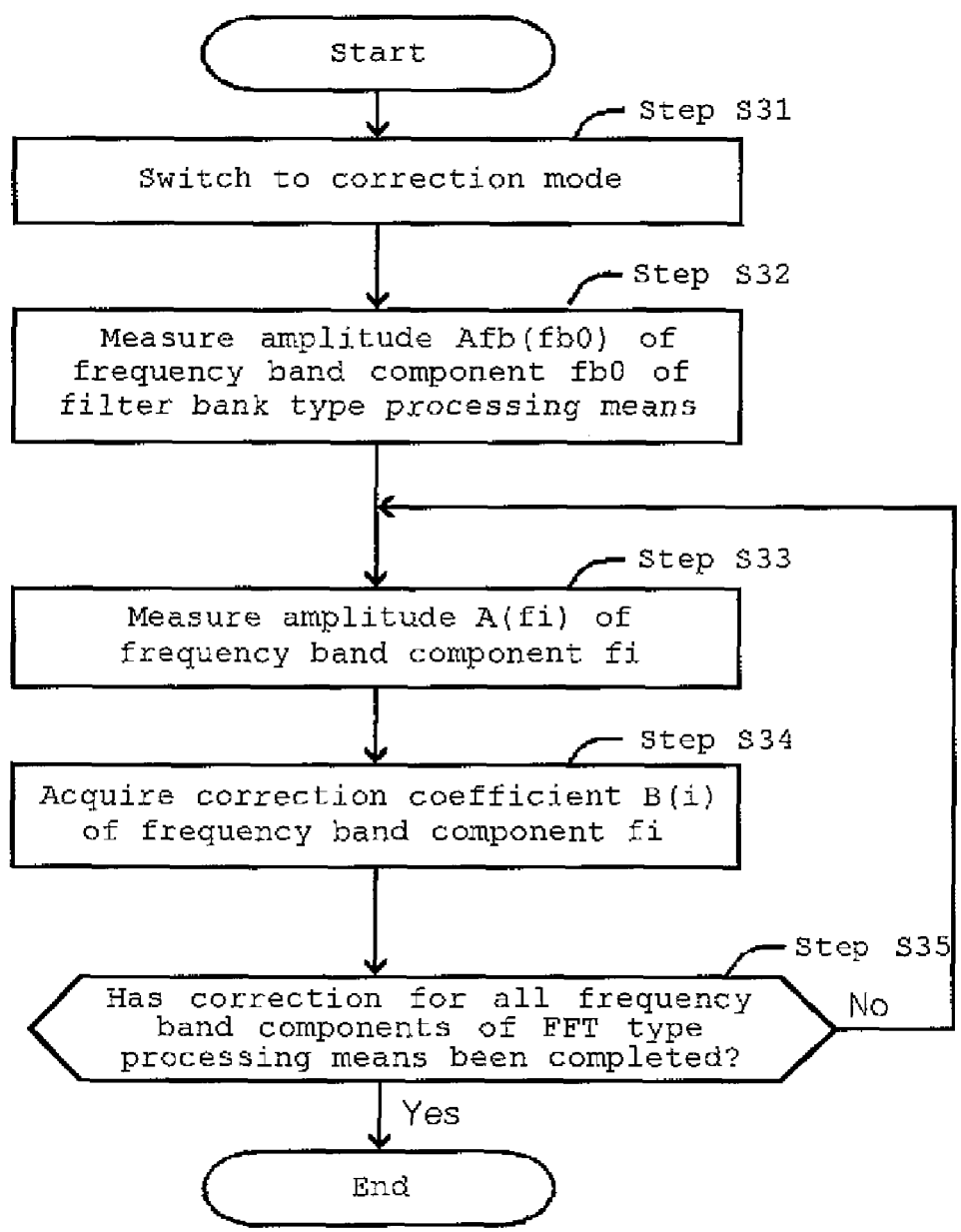
FIG. 7(a) is a flowchart illustrating an operation of setting up a correction coefficient.

An operation of setting up a correction coefficient is first described with reference to FIGS. 6 and 7(a). FIG. 7(a) is a flowchart illustrating the operation of setting up a correction coefficient in the APD measurement apparatus relating to the modified embodiment 2.

(Step S31)

First, the operation mode of the measurement apparatus switches to the correction mode. In the correction mode, a correction coefficient for correcting each of amplitudes wave-detected by the wave detector Det1 to Detn is calculated, and the calculated correction coefficient is set up in the wave detectors. The calculation of the correction coefficient and the correction of the corresponding wave detector are performed by the correction means 900A.

(Step S32)

The correction means 900A first finds the amplitude (i.e., a criterion for the correction) of the filter bank type processing means 132. In the case in which the amplitude is found using the filter of a frequency band component fb0 in the filter bank type processing means 132, a signal for the correction, having a predetermined amplitude Ain(fbO) and a frequency band component fb0, is inputted to the measurement apparatus as an input signal to the measurement apparatus. Next, an amplitude Afb(fbO) of the frequency band component fb0 of the filter bank type processing means 132 is acquired from a wave detector DetfbO corresponding to the frequency band component fb0.

Here, the correction means 900A informs a selector 133 that the frequency band component fb0 is assigned to the filter bank type processing means 132 through the control unit 700. The selector 133 receives such information from the correction means 900A and inputs the output of the filter bank type processing means 132 to the wave detector Detfb0 corresponding to the frequency band component fb0. Accordingly, the correction means 900A can obtain the output of the filter bank type processing means 132 from the wave detector DetfbO.

Next, the correction coefficient is set up in the wave detectors Det1 to Detn. The set-up of the correction coefficient in the wave detectors Det1 to Detn is performed for every frequency band component. The frequency band component of a frequency fi (hereinafter referred to as a 'frequency band component fi') is described below as an example.

(Step S33)

The correction means 900A first inputs a signal for the correction, having a predetermined amplitude Ain(fi) and the frequency band component fi, to the measurement apparatus as an input signal to the measurement apparatus and then acquires an amplitude Aout(fi) of the frequency band component fi from a wave detector Detfi corresponding to the frequency band component fi.

(Step S34)

Next, the correction means 900A calculates a correction coefficient β(fi) of the frequency band component fi by comparing the amplitudes Aout(fi) and Afb(fbO). An equation for calculating the correction coefficient β(fi) is shown below.

[Equation 11]

$$\beta(fi) = \frac{Afb(fb0)}{Aout(fi)} \quad \text{A(A)}$$

$$= 1 - \frac{Aout(fi) - Afb(fb0)}{Aout(fi)} \quad \text{A(B)}$$

The calculated correction coefficient β(fi) is set up in the wave detector Detfi. The wave detector Detfi corrects the amplitude A(fi) of the frequency band component fi of a signal (i.e., the subject of measurement), using the correction coefficient β(fi) when an APD is measured. Meanwhile, which one of A and B will be used as the equation for calculating the correction coefficient β(fi) depends on the construction of a level detection unit 200. The correction coefficient β(fi) for each frequency band component is stored in the storage means (not shown) of the wave detector Detfi.

(Step S35)

After the correction coefficient relating to the frequency band component fi is completed, the correction means 900A sets up a correction coefficient for a next frequency band component (No at step S35). After all the correction coefficients for all the frequency band components are calculated and set up (Yes at step S35), the set-up processing for the correction coefficients is finished.

(Measurement of an APD)

Figure 7B:
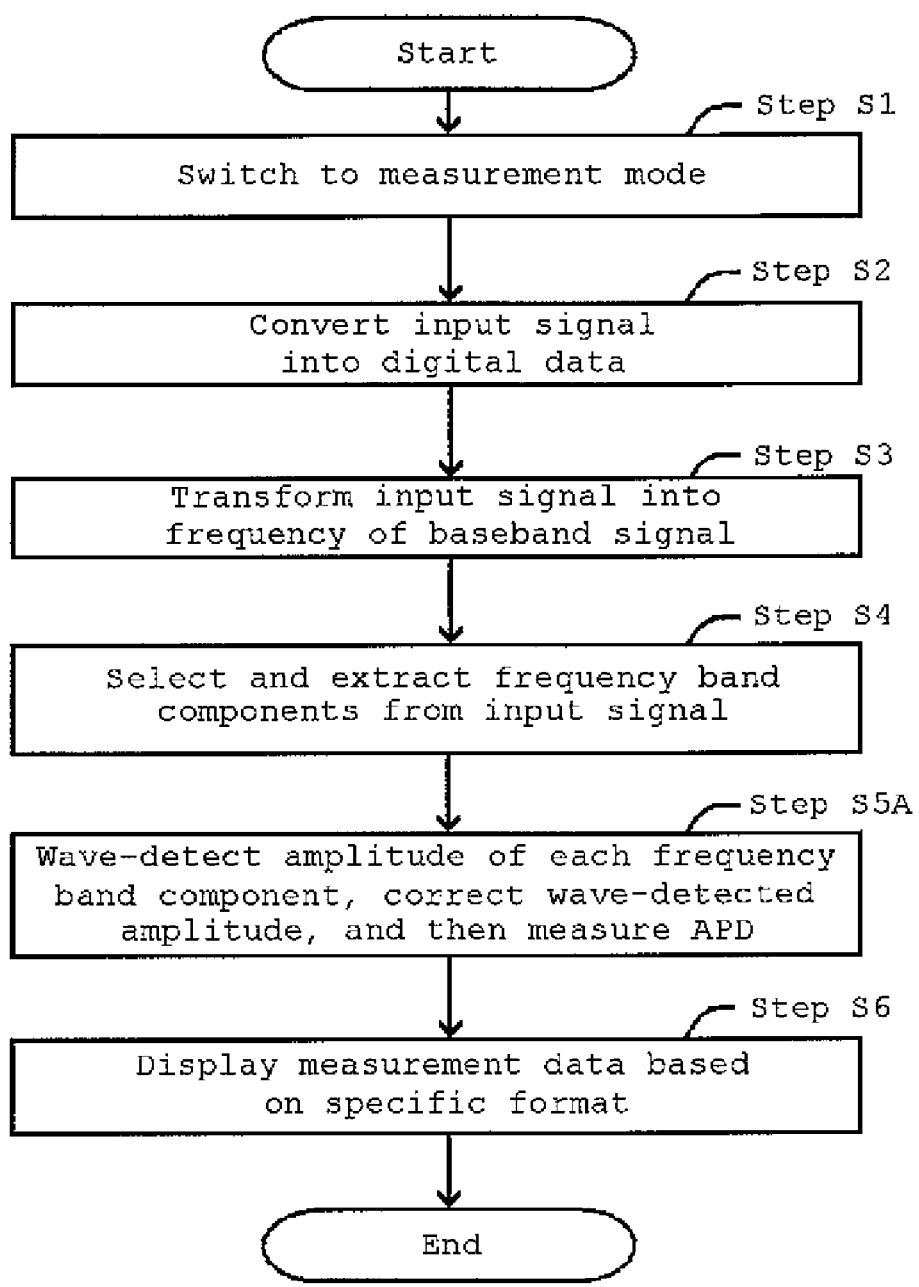
FIG. 7(b) is a flowchart illustrating an operation of measuring an APD.

The measurement of an APD is described below with reference to FIG. 7(b). FIG. 7(b) is a flowchart illustrating a series of operations for measuring an APD in the APD measurement apparatus relating to the modified embodiment 2. Meanwhile, the operations from a step S1 to a step S4 and the operation of step S6 are identical with those of the APD measurement apparatus relating to the first embodiment, and a description thereof is omitted. Only a characteristic portion of the operation of step S5A is described below.

(Step S5A)

The level detection unit 200 receives the frequency band components, extracted by the frequency selection means 130 from the input signal converted into digital data, through the wave detectors Det1 to Detn corresponding to the respective frequency band components, corrects the frequency band components using the respective correction coefficients, log-transforms the corrected frequency band components using LOG transform means (not shown), and outputs results to an APD unit 300.

The correction operation is described in more detail below by taking the frequency band component fi as an example. The frequency band component fi extracted by the frequency selection means 130 is inputted to a wave detector Detfi within the level detection unit 200. The wave detector Detfi acquires the amplitude A(fi) of the frequency band component fi and corrects the amplitude A(fi) using the correction coefficient β(fi) stored in memory means through previous correction at the same time, and then inputs a corrected result to APDfi corresponding to the frequency band component fi. An equation for calculating an amplitude A'(fi) after the frequency band component fi is corrected is shown below.

$$A'(fi) = \beta(fi) * A(fi) \quad \text{[Equation 12]}$$

The APD unit 300 measures an APD from the amplitude value outputted (log-transformed) by the level detection unit 200. The operation of the APD unit 300 is identical with that of the APD measurement apparatus relating to the first embodiment, and a description thereof is omitted.

As described above, the correction means 900A corrects the amplitude value, outputted by each of the wave detectors Det1 to Detn of the level detection unit 200, based on each of the amplitudes of the frequency band components extracted by the filter bank type processing means 132. Accordingly, measurement can be performed with a higher accuracy.

As described above, according to the present invention, frequency selection means of the FFT type processing means and the filter bank type processing means separately set up frequency band components (i.e., the subject of measurement). Accordingly, an increase of the processing time resulting from an increase of the number of channels can be reduced.

Furthermore, since the cycle of a clock signal inputted to the A/D conversion means, the frequency selection means, or the APD unit is changed, a measurement condition, such as the resolution bandwidth (RBW) or the number of channels, can be flexibly changed in compliance with a standard for the subject of measurement through any one of or both the FFT type processing means and the filter bank type processing means. The APD measurement apparatus of the present invention is a general-purpose measurement apparatus, and it can measure a variety of the subjects of measurement. Accordingly, the expenses can be reduced because a measurement apparatus needs not to be switched according to the subject of measurement. Furthermore, since measurement conditions can be flexibly changed, load upon measurement can be distributed and the processing speed can be easily improved, by controlling the measurement condition and also increasing the measurement apparatus in parallel.

Furthermore, the frequency selection means of both the FFT type processing means and the filter bank type processing means are used, and the gain of the FFT type processing means is corrected using the gain of the filter bank type processing means with a high accuracy of measurement. Accordingly, since measurement conditions can be flexibly changed, a variety of standards can be accommodated, and measurement is possible with a high accuracy.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An amplitude probability distribution measurement apparatus comprising:
   a frequency analysis unit having Analog/Digital (A/D) conversion means for sampling an input signal, converting the input signal into digital data, and outputting the digital data and frequency selection means for extracting predetermined frequency band components to be measured from the digital data;
   a level detection unit for detecting an amplitude of each of the frequency band components to be measured which are acquired by the frequency analysis unit; and
   an amplitude probability distribution measurement unit for finding an amplitude probability distribution, which is a probability that an amplitude of each measurement frequency band component to be measured exceeds a predetermined threshold value, every lapse of time,
   wherein said frequency selection means comprises Fast Fourier Transform (FFT) type processing means forming a filter for extracting said frequency band components to be measured from the digital data through an FFT operation, filter bank type processing means which is composed of a plurality of filters for extracting said frequency band components from the digital data, and a selector for switching an output extracted from said FFT type processing means and an output extracted from said filter bank type processing means according to said frequency band components to be measured,
   the amplitude probability distribution measurement apparatus further comprising correction means for comparing amplitudes of the frequency band components to be measured, extracted by the FFT type processing means, and amplitudes of the frequency band components to be measured, extracted by the filter bank type processing means, and for correcting the amplitudes outputted by the FFT type processing means and generated when the FFT operation is performed based on a result of the comparison.

2. An amplitude probability distribution measurement apparatus comprising:
   a frequency analysis unit having Analog/Digital (A/D) conversion means for sampling an input signal, converting the input signal into digital data, and outputting the digital data and frequency selection means for extracting predetermined frequency band components to be measured from the digital data;
   a level detection unit for detecting an amplitude of each of the frequency band components to be measured which are acquired by the frequency analysis unit; and
   an amplitude probability distribution measurement unit for finding an amplitude probability distribution, which is a probability that an amplitude of each measurement frequency band component to be measured exceeds a predetermined threshold value, every lapse of time,
   wherein said frequency selection means comprises Fast Fourier Transform (FFT) type processing means forming a filter for extracting said frequency band components to be measured from the digital data through an FFT operation, filter bank type processing means which is composed of a plurality of filters for extracting said frequency band components from the digital data and a selector for switching an output extracted from said FFT type processing means and an output extracted from said filter bank type processing means according to said frequency band components to be measured,
   the amplitude probability distribution measurement apparatus further comprising resolution bandwidth (RBW)/measurement channel control means including a clock generator for generating a clock signal, wherein the RBW/measurement channel control means changes a cycle of the clock signal generated by the clock generator and changes a resolution bandwidth when measurement is performed, a number of channels to be measured which is a number of measurement frequency band components, or said predetermined time when an amplitude probability distribution is measured by sending the clock signal to each of the A/D conversion means, the frequency selection means, and the amplitude probability distribution measurement unit.

3. The amplitude probability distribution measurement apparatus as claimed in claim 2, wherein the RBW/measurement channel control means individually sets up a resolution bandwidth (RBW) when measurement is performed or a number of channels to be measured for each of the FFT type processing means and the filter bank type processing means.

* * * * *